US009052730B2

(12) United States Patent
Chen et al.

(10) Patent No.: US 9,052,730 B2
(45) Date of Patent: Jun. 9, 2015

(54) CALIBRATION CIRCUIT FOR VOLTAGE REGULATOR

(71) Applicants: Chi-Yang Chen, Tainan (TW); San-Yueh Huang, Tainan (TW)

(72) Inventors: Chi-Yang Chen, Tainan (TW); San-Yueh Huang, Tainan (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 219 days.

(21) Appl. No.: 13/676,137

(22) Filed: Nov. 14, 2012

(65) Prior Publication Data

US 2014/0097816 A1 Apr. 10, 2014

(30) Foreign Application Priority Data

Oct. 5, 2012 (TW) ............................. 101136947 A

(51) Int. Cl.
*H03L 7/00* (2006.01)
*G05F 1/46* (2006.01)

(52) U.S. Cl.
CPC ...................................... *G05F 1/468* (2013.01)

(58) Field of Classification Search
CPC .... G01R 19/16552; H02M 3/073; H03K 3/11
USPC ......... 327/143, 198, 276, 513, 538, 539, 543, 327/407; 323/222, 224, 234, 273, 297, 280, 323/316
See application file for complete search history.

(56) References Cited

U.S. PATENT DOCUMENTS 4,810,948 A * 3/1989 Takuma ........................ 323/280
5,459,684 A * 10/1995 Nakamura et al. ............ 365/149
6,160,755 A * 12/2000 Norman et al. .......... 365/233.15
6,313,776 B1 * 11/2001 Brown .......................... 341/144
7,164,997 B2 * 1/2007 Batra et al. ...................... 702/64
7,199,645 B2 * 4/2007 Chang et al. .................. 327/538
7,356,716 B2 4/2008 Boerstler et al.
7,863,876 B2 1/2011 Cook et al.
7,907,002 B2 3/2011 Bracmard et al.
7,944,248 B2 * 5/2011 Nguyen et al. .................. 327/73
8,129,969 B1 * 3/2012 Chui et al. .................... 323/283
8,680,902 B1 * 3/2014 Wright .......................... 327/143

(Continued)

FOREIGN PATENT DOCUMENTS

TW I341447 5/2011
TW I341964 5/2011

(Continued)

OTHER PUBLICATIONS

"Office Action of Taiwan Counterpart Application", issued on Nov. 21, 2014, p. 1-p. 4, in which the listed references were cited.

*Primary Examiner* — Rajnikant Patel
(74) *Attorney, Agent, or Firm* — Winston Hsu; Scott Margo

(57) ABSTRACT

A voltage regulator calibration circuit including a voltage regulator and a calibration unit is provided. The voltage regulator regulates an output voltage according to a reference voltage and a feedback voltage. The feedback voltage is in direct proportion to the output voltage. The calibration unit is coupled to the voltage regulator. The calibration unit generates a control code through binary search according to the output voltage and a target voltage. The control code determines the proportion of the feedback voltage to the output voltage.

9 Claims, 4 Drawing Sheets

(56) References Cited

U.S. PATENT DOCUMENTS

| | | | | |
|---|---|---|---|---|
| 8,786,357 | B1 * | 7/2014 | Wright | 327/538 |
| 2010/0213909 | A1 | 8/2010 | Nakashimo | |

FOREIGN PATENT DOCUMENTS

| | | |
|---|---|---|
| TW | 201235812 | 9/2012 |
| TW | 201237586 | 9/2012 |

* cited by examiner

CALIBRATION CIRCUIT FOR VOLTAGE REGULATOR

CROSS-REFERENCE TO RELATED APPLICATION

This application claims the priority benefit of Taiwan application Ser. No. 101136947, filed on Oct. 5, 2012. The entirety of the above-mentioned patent application is hereby incorporated by reference herein and made a part of this specification.

BACKGROUND OF THE INVENTION

1. Field of the Invention

The invention generally relates to a calibration circuit, and more particularly, to a calibration circuit adapted to a voltage regulator.

2. Description of Related Art

A voltage regulator is usually adopted in each existing circuit system for providing a precise output voltage as the reference of other circuit operations. Generally, a voltage regulator generates its own reference voltage and regulates aforementioned output voltage through an operational amplifier and a feedback mechanism.

However, the self-generated reference voltage may not be precise and may come with an error. Besides, the operational amplifier itself may cause offset in the output voltage. Thus, the output voltage of the voltage regulator may not be precise. Such a voltage regulator needs to be calibrated in order to provide a precise output voltage.

SUMMARY OF THE INVENTION

Accordingly, the invention is directed to a calibration circuit for a voltage regulator, in which the calibration can be quickly done to compensate for aforementioned error and offset, so that the voltage regulator can provide a precise output voltage.

The invention provides a voltage regulator calibration circuit. The voltage regulator calibration circuit includes a voltage regulator and a calibration unit. The voltage regulator regulates an output voltage according to a reference voltage and a feedback voltage. The feedback voltage is in direct proportion to the output voltage. The calibration unit is coupled to the voltage regulator. The calibration unit generates a control code according to the output voltage and a target voltage through binary search. The control code determines the proportion of the feedback voltage to the output voltage.

The invention further provides a voltage regulator calibration circuit. The voltage regulator calibration circuit includes a comparator and a control unit. The comparator compares a target voltage with an output voltage of a voltage regulator and outputs a bit value according to the result of the comparison. The control unit is coupled to the comparator. The control unit generates a control code according to the bit value through binary search.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
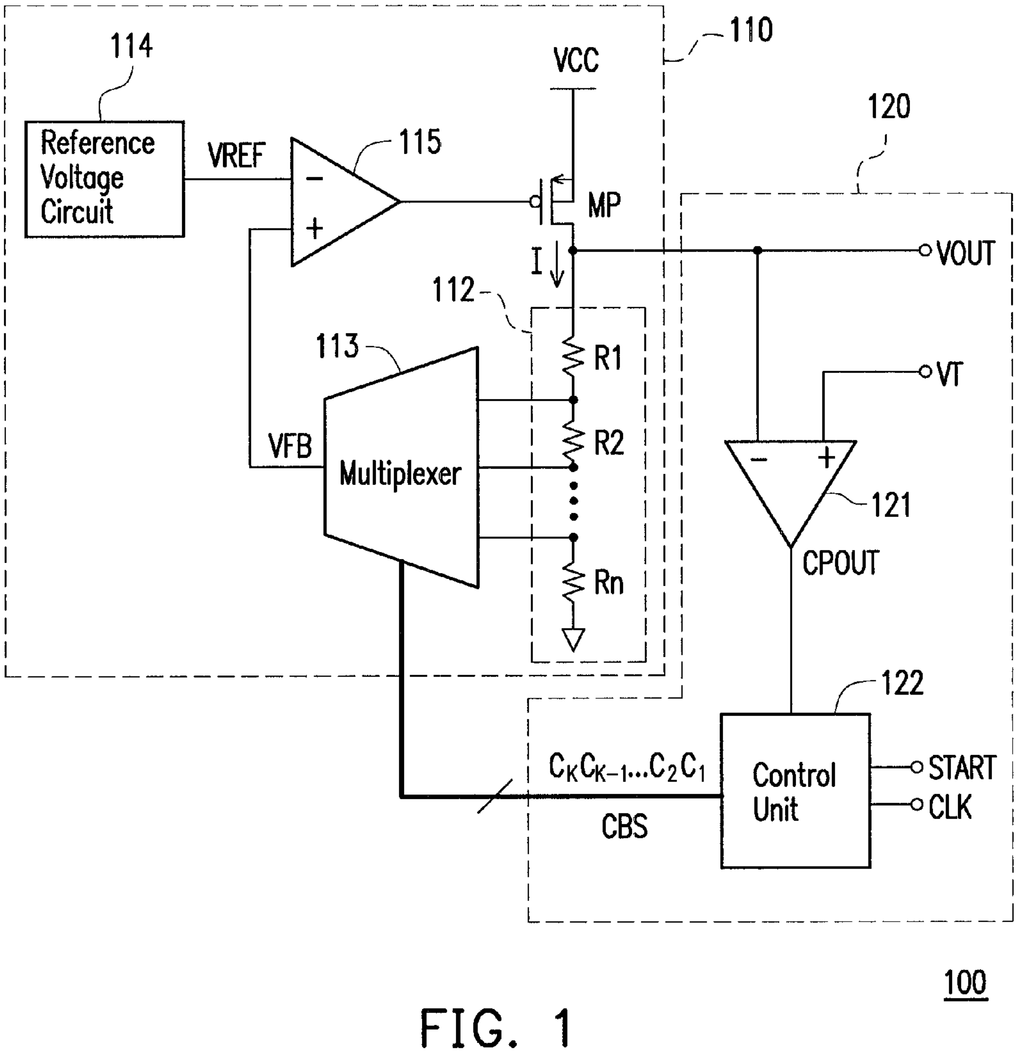
FIG. 1 is a schematic diagram of a voltage regulator calibration circuit according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a voltage regulator calibration circuit 100 according to an embodiment of the invention. The voltage regulator calibration circuit 100 includes a voltage regulator 110 and a calibration unit 120. The calibration unit 120 is coupled to the voltage regulator 110. VOUT is an output voltage of the voltage regulator 110, VREF is a reference voltage generated inside the voltage regulator 110, and VT is a target voltage received from outside of the voltage regulator calibration circuit 100. The voltage regulator 110 is designed to provide the output voltage VOUT identical to the target voltage VT. Theoretically, the reference voltage VREF is equal to the target voltage VT. However, the reference voltage VREF usually comes with an error. The target voltage VT is a precise voltage (i.e., with no error) provided by an external testing equipment when the voltage regulator 110 is tested or calibrated. However, because the voltage regulator 110 does not receive the target voltage VT and has only the reference voltage VREF during its normal operation, the calibration unit 120 is disposed for calibrating the voltage regulator 110 and allowing the voltage regulator 110 to provide the output voltage VOUT identical to the target voltage VT according to only the reference voltage VREF.

The voltage regulator 110 includes a transistor MP, a voltage divider 112, a multiplexer 113, a reference voltage circuit 114, and an operational amplifier 115. The transistor MP is coupled to an operating voltage VCC. In the present embodiment, the transistor MP is a metal-oxide-semiconductor field-effect transistor (MOSFET). One terminal of the voltage divider 112 is coupled to the transistor MP, and another terminal thereof is grounded. The voltage divider 112 provides the output voltage VOUT according to a current I supplied by the transistor MP and provides a plurality of divided voltages of the output voltage VOUT. The multiplexer 113 is coupled to the voltage divider 112 and the calibration unit 120. The multiplexer 113 provides one of the divided voltages of the output voltage VOUT as a feedback voltage VFB according to a control code CBS provided by the calibration unit 120. Due to the resistance divided voltage effect of the voltage divider 112, each divided voltage of the output voltage VOUT is in direct proportion to the output voltage VOUT. Accordingly, the feedback voltage VFB is in direct proportion to the output voltage VOUT.

The reference voltage circuit 114 generates and provides the reference voltage VREF. The operational amplifier 115 is coupled to the multiplexer 113, the reference voltage circuit 114, and the transistor MP. The operational amplifier 115 amplifies the error between the feedback voltage VFB and the reference voltage VREF and drives the transistor MP by using this error voltage. Namely, the operational amplifier 115 can control the volume of the current I according to the error between the reference voltage VREF and the feedback voltage VFB, so as to regulate the output voltage VOUT.

The voltage divider 112 includes n resistors R1-Rn, where n is a predetermined positive integer. The first resistor R1 is coupled to the transistor MP and provides the output voltage VOUT, each of the other resistors is coupled to the previous resistor and provides one of the divided voltages of the output voltage VOUT, and one end of the last resistor Rn is grounded. As shown in FIG. 1, each of the resistors R1-Rn has an upper and a lower end, and the voltage or divided voltage provided by each of the resistors R1-Rn refers to the voltage at the upper end of the resistor.

In the present embodiment, the control code CBS has K bits $C_1$-$C_K$, where K is a predetermined positive integer. The first bit $C_1$ of the control code CBS is the least significant bit (LSB), and the $K^{th}$ bit $C_K$ of the control code CBS is the most significant bit (MSB). The number n of resistors in the voltage divider 112 is equal to $2^K+1$. When the value of the control code CBS is i, the multiplexer 113 provides the divided voltage provided by the $(n-i)^{th}$ resistor of the voltage divider 112 as the feedback voltage VFB, where i is an integer and satisfies $0<=i<=2^K-1$. Because the control code CBS determines the divided voltage selected by the multiplexer 113 as the feedback voltage VFB, the control code CBS determines the proportion of the feedback voltage VFB to the output voltage VOUT.

The calibration unit 120 generates the control code CBS through binary search according to the output voltage VOUT and the target voltage VT. The calibration unit 120 includes a comparator 121 and a control unit 122. The comparator 121 is coupled to the voltage regulator 110. The comparator 121 compares the output voltage VOUT with the target voltage VT and outputs a bit value CPOUT according to the result of the comparison. When the output voltage VOUT is higher than the target voltage VT, the bit value CPOUT is 0, and when the output voltage VOUT is lower than the target voltage VT, the bit value CPOUT is 1. The control unit 122 is coupled to the comparator 121 and the multiplexer 113. The control unit 122 generates the control code CBS through the binary search according to the bit value CPOUT.

Figure 2:
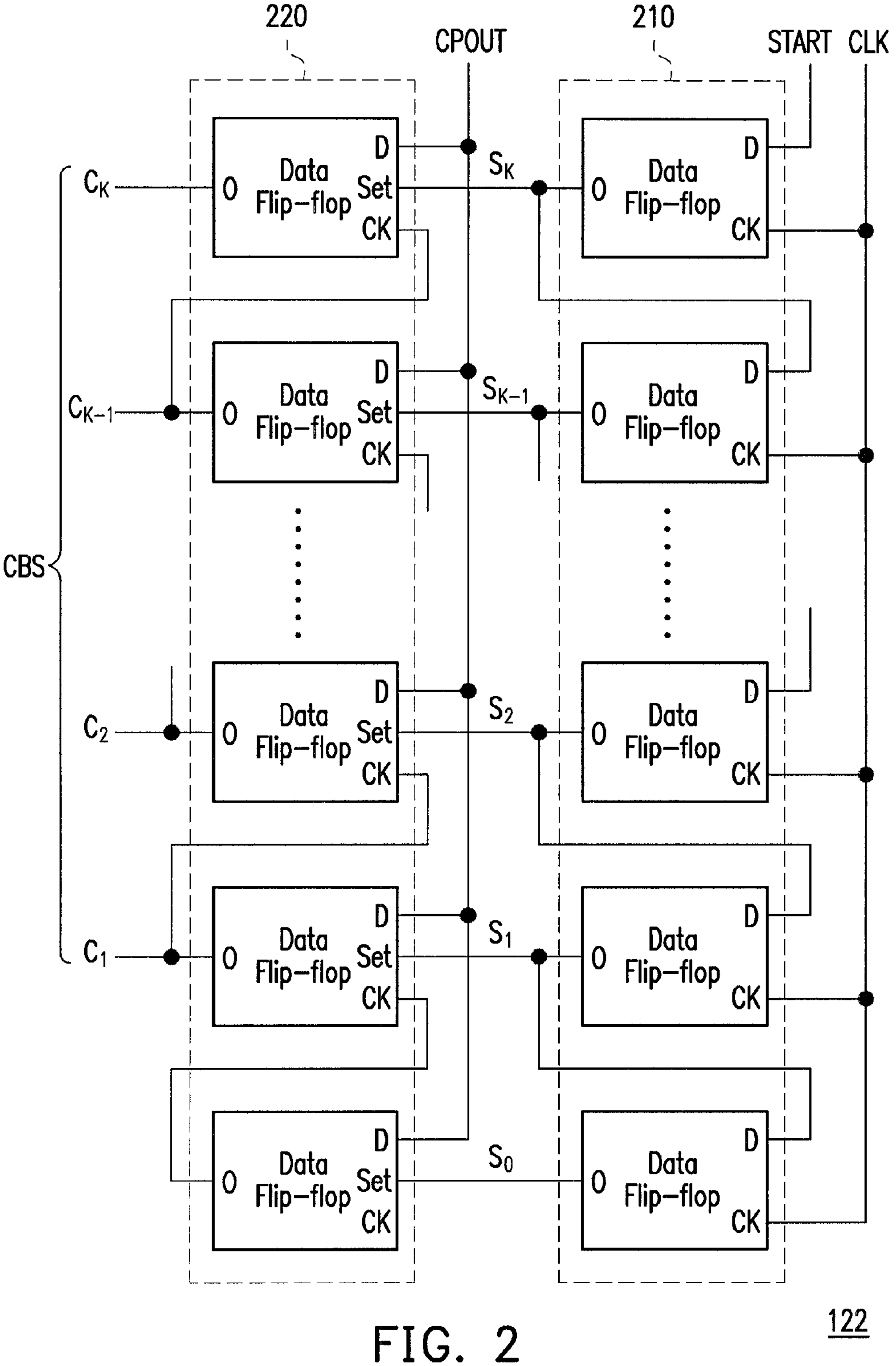
FIG. 2 is a schematic diagram of a control unit according to an embodiment of the invention.

FIG. 2 is a schematic diagram of the control unit 122 according to an embodiment of the invention. The control unit 122 receives the bit value CPOUT, a clock signal CLK, and an activating signal START. The clock signal CLK and the activating signal START can be provided by an external testing equipment when the voltage regulator 110 is tested or calibrated. The control unit 122 includes K+1 first data flip-flops 210 and K+1 second data flip-flops 220. These two groups of data flip-flops are sequentially referenced from the bottom to the top (i.e., the $0^{th}$ data flip-flop is at the bottom, and the $K^{th}$ data flip-flop is at the top).

The clock terminal CK of each first data flip-flop 210 receives the clock signal CLK. The data terminal D of the $j^{th}$ first data flip-flop 210 is coupled to the output terminal O of the $(j+1)^{th}$ first data flip-flop 210, where j is an integer and satisfies $0<=j<=K-1$. The data terminal D of the $K^{th}$ first data flip-flop 210 receives the activating signal START.

The K+1 second data flip-flops 220 are respectively corresponding to the K+1 first data flip-flops 210. The data terminal D of each second data flip-flop 220 receives the bit value CPOUT. The setting terminal Set of each second data flip-flop 220 is coupled to the output terminal O of the corresponding first data flip-flop 210. The output terminal O of the $j^{th}$ second data flip-flop 220 is coupled to the clock terminal CK of the $(j+1)^{th}$ second data flip-flop 220. The control code CBS is composed of the outputs of the $1^{st}$ second data flip-flop 220 to the $K^{th}$ second data flip-flop 220.

Figure 3:
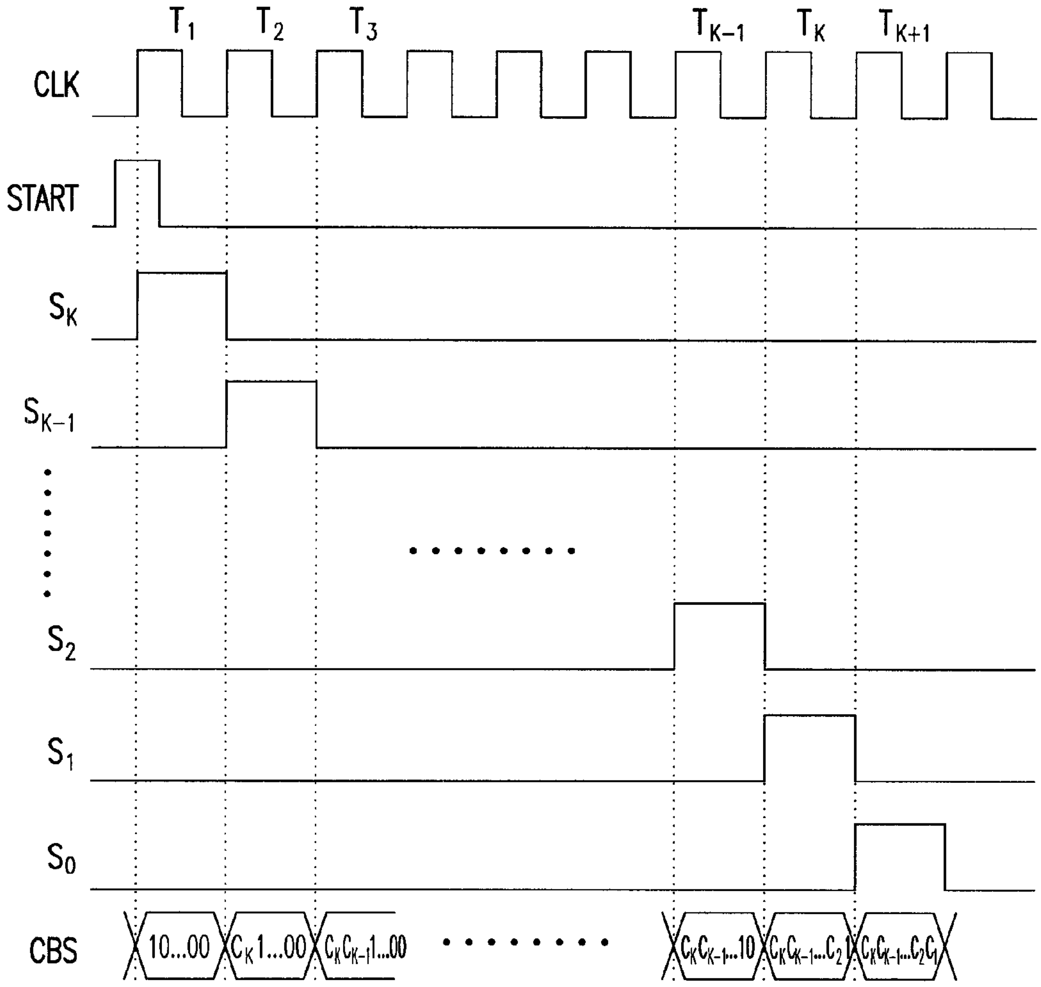
FIG. 3 illustrates signal waveforms of a control unit according to an embodiment of the invention.

FIG. 3 illustrates waveforms of the clock signal CLK, the activating signal START, the outputs $S_K$-$S_0$ of the first data flip-flops 210, and the control code CBS in the control unit 122 according to an embodiment of the invention. $T_1$-$T_{K+1}$ are K+1 clock cycles after the activating signal START sends out pulses. As shown in FIG. 3, the K+1 first data flip-flops 210 form a shift register and sequentially forward the activating signal START to generate the outputs $S_K$-$S_0$. The pulses of the outputs $S_K$-$S_0$ compulsively set the output terminal O of the corresponding second data flip-flop 220 to a logic high level to trigger the next second data flip-flop 220 to latch the current bit value CPOUT, so as to generate the control code CBS.

Figure 4:
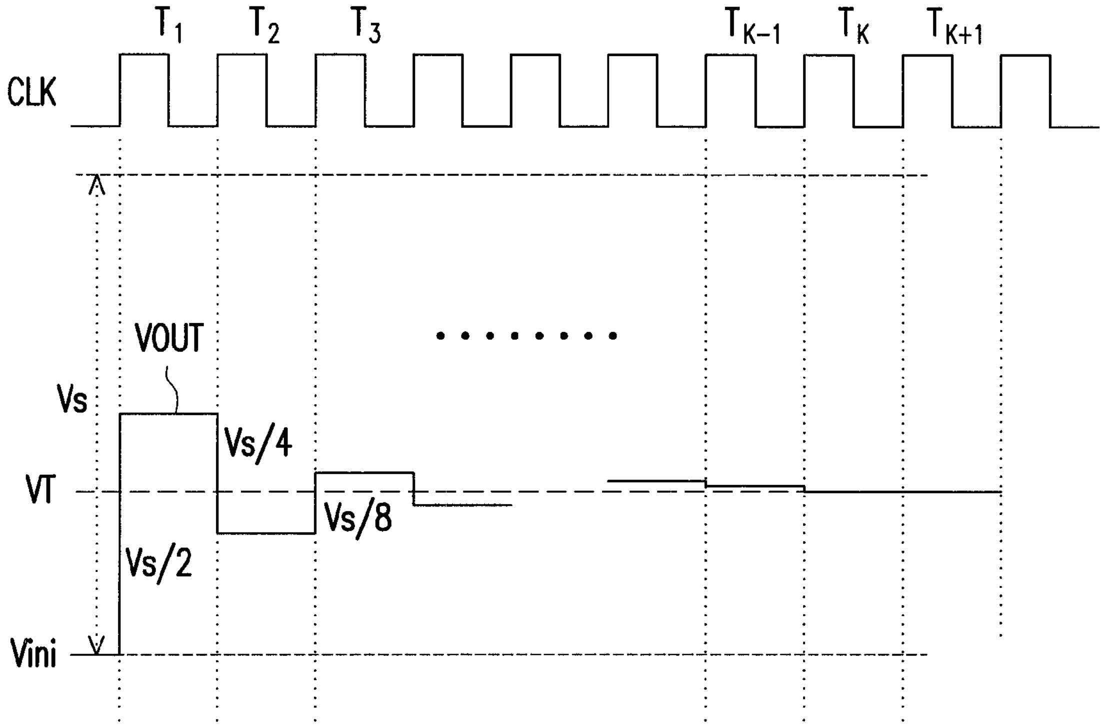
FIG. 4 illustrates signal waveforms of a voltage regulator calibration circuit according to an embodiment of the invention.

FIG. 4 illustrates the waveforms of the clock signal CLK and the output voltage VOUT in the voltage regulator calibration circuit 100 according to an embodiment of the invention. In FIG. 4, the range Vs is the variation range of the output voltage VOUT corresponding to the entire value range of the control code CBS, and the reference voltage Vini is the output voltage VOUT when the control code CBS is 0.

Referring to FIG. 3 and FIG. 4, during the first cycle $T_1$ of the clock signal CLK, the $K^{th}$ first data flip-flop 210 latches the activating signal START so that the output $S_K$ thereof becomes 1. The output $S_K$ sets the output $C_K$ of the $K^{th}$ second data flip-flop 220 to 1. Herein all the other bits $C_{K-1}$-$C_1$ of the control code CBS are 0. Namely, during the first cycle $T_1$ of the clock signal CLK, the control unit 122 sets the control code CBS to an initial value.

This initial value allows the output voltage VOUT to be equal to Vini+Vs/2. Herein the output voltage VOUT is higher than the target voltage VT, and the bit value CPOUT output by the comparator 121 is 0.

During the second cycle $T_2$ of the clock signal CLK, the $(K-1)^{th}$ first data flip-flop 210 latches the output $S_K$, so that the output $S_{K-1}$ thereof becomes 1. The output $S_{K-1}$ sets the output $C_{K-1}$ of the $(K-1)^{th}$ second data flip-flop 220 to 1 and triggers the $K^{th}$ second data flip-flop 220 to latch the bit value CPOUT. Herein all the bits $C_{K-2}$-$C_1$ of the control code CBS are 0, and the output voltage VOUT corresponding to the control code CBS is equal to Vini+Vs/4. Because herein the output voltage VOUT is lower than the target voltage VT, the bit value CPOUT output by the comparator 121 is 1.

During the third cycle $T_3$ of the clock signal CLK, the $(K-2)^{th}$ first data flip-flop 210 latches the output $S_{K-1}$, so that the output $S_{K-2}$ thereof becomes 1. The output $S_{K-2}$ sets the output $C_{K-2}$ of the $(K-2)^{th}$ second data flip-flop 220 to 1 and triggers the $(K-1)^{th}$ second data flip-flop 220 to latch the bit value CPOUT. Herein all the bits $C_{K-3}$-$C_1$ of the control code CBS are 0, and the output voltage VOUT corresponding to the control code CBS is equal to Vini+Vs*3/8. Because herein the output voltage VOUT is higher than the target voltage VT, the bit value CPOUT output by the comparator 121 is 0.

Similarly, the control unit 122 latches the bit value CPOUT as the $(K-i+2)^{th}$ bit of the control code CBS during the $i^{th}$ cycle of the clock signal CLK, where i is an integer and satisfies $2<=i<=K+1$. When i is smaller than K+1, the control unit 122 sets the $(K-i+1)^{th}$ bit of the control code CBS to 1 during the $i^{th}$ cycle of the clock signal CLK. Based on the mechanism described above, the control unit 122 can determine each bit of the control code CBS through binary search during the K+1 clock cycles $T_1$-$T_{K+1}$, so as to generate a complete control code CBS. After the complete control code CBS is generated, the output voltage VOUT can be expressed as:

$$VOUT=Vini+C_K*Vs/2+C_{K-1}*Vs/2^2+C_{K-2}*Vs/2^3+\ldots+C_2*Vs/2^{K-1}+C_1*Vs/2^K.$$

After that, the activating signal START stops sending pulses, and the control code CBS latched by the control unit 122 remains unchanged and can be continuously used for calibration.

As described above, in a voltage regulator calibration circuit provided by the invention, the error of the reference voltage and the offset produced by the operational amplifier can be compensated for, so that a precise output voltage. Additionally, in the voltage regulator calibration circuit provided by the invention, binary search is used such that the calibration procedure can be quickly completed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A voltage regulator calibration circuit, comprising:

a voltage regulator, regulating an output voltage according to a reference voltage and a feedback voltage, wherein the feedback voltage is in direct proportion to the output voltage; and a calibration unit, coupled to the voltage regulator, and generating a control code through a binary search according to the output voltage and a target voltage, wherein the control code determines a proportion of the feedback voltage to the output voltage, wherein the calibration unit comprises:

a comparator, coupled to the voltage regulator, comparing the output voltage with the target voltage, and outputting a bit value according to a result of the comparison; and a control unit, coupled to the comparator and a multiplexer, and generating the control code through the binary search according to the bit value, wherein a bit number of the control code is K, K is a predetermined positive integer, a first bit of the control code is a least significant bit (LSB), a $K^{th}$ bit of the control code is a most significant bit (MSB); the control unit receives a clock signal, sets the control code to an initial value during a first cycle of the clock signal, and latches the bit value as a $(K-i+2)^{th}$ bit of the control code during an $i^{th}$ cycle of the clock signal, wherein i is an integer and satisfies 2<=i<=K+1, wherein the control unit receives an activating signal, and the control unit comprises:

K+1 first data flip-flops, wherein a clock terminal of each of the first data flip-flops receives the clock signal, a data terminal of the $j^{th}$ first data flip-flop is coupled to an output terminal of the $(j+1)^{th}$ first data flip-flop, j is an integer and satisfies 0<=j<=K−1, and the data terminal of the $K^{th}$ first data flip-flop receives the activating signal; and K+1 second data flip-flops, respectively corresponding to the K+1 first data flip-flops, wherein a data terminal of each of the second data flip-flops receives the bit value, a setting terminal of each of the second data flip-flop is coupled to the output terminal of the corresponding first data flip-flop, an output terminal of the $j^{th}$ second data flip-flop is coupled to a clock terminal of the $(j+1)^{th}$ second data flip-flop, and the control code is formed by outputs of the $1^{st}$ second data flip-flop to the $K^{th}$ second data flip-flop.

2. The voltage regulator calibration circuit according to claim 1, wherein the voltage regulator comprises:

a transistor, coupled to an operating voltage;

a voltage divider, coupled to the transistor, and providing the output voltage and a plurality of divided voltages of the output voltage according to a current supplied by the transistor;

the multiplexer, coupled to the voltage divider and the calibration unit, and providing one of the divided voltages as the feedback voltage according to the control code;

a reference voltage circuit, providing the reference voltage; and an operational amplifier, coupled to the multiplexer, the reference voltage circuit, and the transistor, and controlling a volume of the current according to an error between the reference voltage and the feedback voltage.

3. The voltage regulator calibration circuit according to claim 2, wherein the voltage divider comprises a plurality of resistors, the first resistor is coupled to the transistor and provides the output voltage, and each of the other resistors is coupled to the previous resistor and provides one of the divided voltages.

4. The voltage regulator calibration circuit according to claim 3, wherein the voltage divider comprises n resistors, $n=2^K+1$; when a value of the control code is m, the multiplexer provides the divided voltage provided by the $(n-m)^{th}$ resistor of the voltage divider as the feedback voltage; and m is an integer and satisfies $0<=m<=2^K-1$.

5. The voltage regulator calibration circuit according to claim 1, wherein when the output voltage is higher than the target voltage, the bit value is 0, and when the output voltage is lower than the target voltage, the bit value is 1.

6. The voltage regulator calibration circuit according to claim 1, wherein when i is smaller than K+1, the control unit sets a $(K-i+1)^{th}$ bit of the control code to 1 during the $i^{th}$ cycle of the clock signal.

7. A voltage regulator calibration circuit, comprising:

a comparator, comparing a target voltage with an output voltage of a voltage regulator, and outputting a bit value according to a result of the comparison; and a control unit, coupled to the comparator, and generating a control code through a binary search according to the bit value, wherein the voltage regulator regulates the output voltage according to a reference voltage and a feedback voltage, the feedback voltage is in direct proportion to the output voltage, and the control code determines a proportion of the feedback voltage to the output voltage, wherein a bit number of the control code is K, K is a predetermined positive integer, a first bit of the control code is a least significant bit (LSB), a $K^{th}$ bit of the control code is a most significant bit (MSB); the control unit receives a clock sets the control code to an initial value during a first cycle of the clock signal, and latches the bit value as a $(K-i+2)^{th}$ bit of the control code during an $i^{th}$ cycle of the clock signal, wherein i is an integer and satisfies 2<=i<=K+1, wherein the control unit receives an activating signal, and the control unit comprises:

K+1 first data flip-flops, wherein a clock terminal of each of the first data flip-flops receives the clock signal, a data terminal of the $j^{th}$ first data flip-flop is coupled to an output terminal of the $(j+1)^{th}$ first data flip-flop, j is a integer and satisfies 0<=j<=K−1, and the data terminal of the $K^{th}$ first data flip-flop receives the activating signal; and K+1 second data flip-flops, respectively corresponding to the K+1 first data flip-flops, wherein a data terminal of each of the second data flip-flops receives the bit value, a setting terminal of each of the second data flip-flop is coupled to the output terminal of the corresponding first data flip-flop, an output terminal of the $j^{th}$ second data flip-flop is coupled to a clock terminal of the $(j+1)^{th}$ second data flip-flop, and the control code is foiined by outputs of the $1^{st}$ second data flip-flop to the $K^{th}$ second data flip-flop.

8. The voltage regulator calibration circuit according to claim 7, wherein when the output voltage is higher than the target voltage, the bit value is 0, and when the output voltage is lower than the target voltage, the bit value is 1.

9. The voltage regulator calibration circuit according to claim 7, wherein when i is smaller than K+1 , the control unit sets a $(K-i+1)^{th}$ bit of the control code to 1 during the $i^{th}$ cycle of the clock signal.

* * * * *